United States Patent [19]

Malinaric et al.

[11] 4,331,948
[45] May 25, 1982

[54] HIGH POWERED OVER-VOLTAGE PROTECTION

[75] Inventors: Paul J. Malinaric, Groton; Vincent Squitieri, Billerica, both of Mass.

[73] Assignee: Chomerics, Inc., Woburn, Mass.

[21] Appl. No.: 177,648

[22] Filed: Aug. 13, 1980

[51] Int. Cl.³ .............................................. H01C 7/10
[52] U.S. Cl. ..................................... 338/21; 252/516; 361/127
[58] Field of Search ................... 338/21, 20, 224, 225, 338/223, 322, 323, 334; 357/51, 80; 361/127, 91, 56, 111; 252/516; 428/432, 698

[56] References Cited

U.S. PATENT DOCUMENTS

| | | | |
|---|---|---|---|
| 2,329,085 | 9/1943 | Ridgway | 252/516 |
| 3,210,460 | 10/1965 | Suelmann | 174/127 X |
| 3,210,461 | 10/1965 | Berg et al. | 338/64 X |
| 3,412,200 | 11/1968 | Virsberg | 174/127 X |
| 3,743,996 | 7/1973 | Harnden, Jr. | 361/91 X |
| 3,896,480 | 7/1975 | Harnden, Jr. | 361/91 X |
| 3,950,604 | 4/1976 | Penneck | 174/68 A |
| 4,074,221 | 2/1978 | Milligan | 338/21 |
| 4,103,619 | 8/1978 | Fletcher | 102/28 R |

Primary Examiner—C. L. Albritton
Attorney, Agent, or Firm—Sewall P. Bronstein; Donald Brown

[57] ABSTRACT

The overload protection material of this invention comprises a plastic preferably an elastomer, e.g. silicone rubber, homogeneously and highly loaded with silicon carbide particles (powder) and a lesser amount of a Group IV B element-carbide particles (powder). The material is preferably form stable and is placed (across) a semiconductor junction or between electrodes of a device to be protected so that when high voltage surges appear across the junction or device to be protected the material breaks down (conducts) before the junction or device is destroyed. The material is bidirectionally conductive in its voltage threshold characteristic and repeatedly recovers unlike a fuse so that it provides continuous high voltage over-voltage (e.g. surge) protection.

17 Claims, 7 Drawing Figures

HIGH POWERED OVER-VOLTAGE PROTECTION

BACKGROUND OF THE INVENTION

High voltage diodes e.g., silicon rectifiers are used today in many applications such as in switching and non-switching power supplies as well as part of a rectifier bridge. These diodes are relatively expensive in the first instance and since they are often subject to high voltage over-voltage (e.g., reverse surges) they are liable to burn out due to the over-voltage causing reverse voltage junction breakdown. This obviously requires repair of the power supply which is quite costly as well as the replacement of the burned out diode. The above identified over-voltage breakdown is also a problem encountered by semiconductor devices such as silicon-controlled rectifiers, and transistors e.g., mosfets as well as other semiconductor junction devices. Over-voltage protection is also needed in a variety of other applications wherever overload voltages are apt to occur e.g., between conductors and conductors to ground of circuit boards, between an insulated pipe junction used for gas or oil transmission and etc.

The present invention provides a material which will function to protect components or equipment against destructive over-voltages.

BRIEF DESCRIPTION OF THE DISCLOSURE

This disclosure concerns an over-voltage protection material and its use in providing overvoltage protection. The material functions at threshold breakdown voltage to effectively limit the voltage across the component, equipment or etc. being protected by bypassing or shunting the damaging current produced by the overvoltage. The material is selected to have a threshold conduction voltage less than the reverse breakdown voltage of a component such as a diode, transistor, etc. being protected.

In particular, it has now been found that a threshold voltage breakdown material containing silicon carbide particles (powder) and a lesser amount by volume of a Group IV B element—carbide particles (powder) in a dielectric plastic binder will have a significantly lower breakdown voltage than that achievable using silicon carbide particles alone. Unexpectedly, it has been found that the addition of Group IV B element—carbide particles does not significantly effect the important non linear voltage breakdown characteristics in comparison with the use of silicon carbide particles alone.

Group IV B elements are: Titantium (Ti), Zirconium (Zr), and Hafnium (Hf) as shown in the next "University Chemistry" Bailar et al, D. C. Heath & Company, Boston, MA, Copyright 1965, Library of Congress card No. 65-11347.

DETAILED DESCRIPTION OF THE DISCLOSURE

Figure 1:
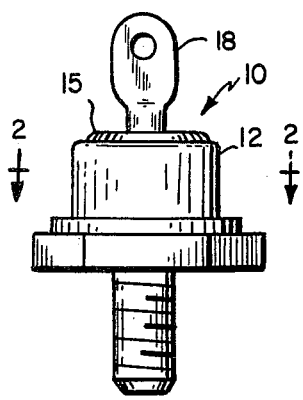
FIG. 1 is a side view of a conventional silicon rectifier package incorporating a semiconductor rectifier (diode) having a PN junction.
Figure 2:
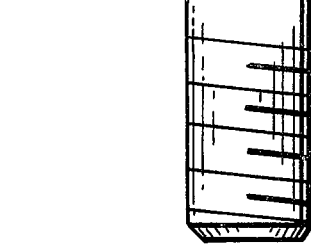
FIG. 2 is a sectional view taken along line 2—2 in FIG. 1.
Figure 3:
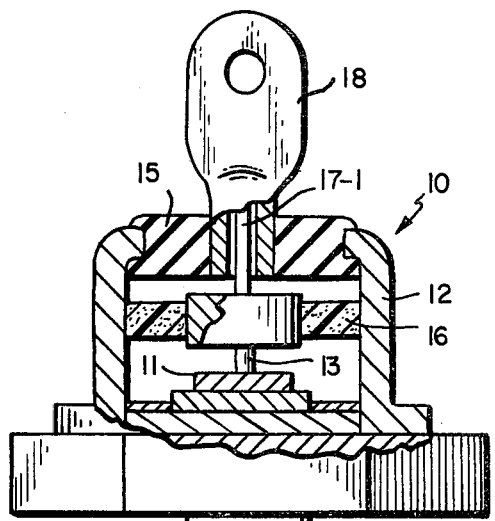
FIG. 3 is an enlarged sectional view taken along line 3—3 in FIG. 2.

Reference should now be had to FIGS. 1 to 6 for a description of the disclosure:

In FIGS. 1 to 3 there is shown a conventional rectifier assembly (package) 10 having a semiconductor junction device (rectifier) shown as at 11. One side of the rectifier junction is directly coupled in a conventional manner, e.g.; metal support to the metal outer portion (case) of the assembly 12 and the other side of the junction is coupled by welding to a lead wire 13 which extends upwardly as shown.

Obviously the package may take many shapes, e.g., see the brochures put out by various manufacturers of rectifiers. Since the invention does not reside in the diode rectifier itself, or its construction, it will not be discussed in any further detail.

Figure 4:
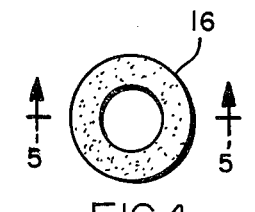
FIG. 4 is a top plan view of the voltage protection material of this invention in a form stable shape for positioning in the assembly (package) of FIGS. 1 and 2 and as shown in the detail in FIG. 3.
Figure 5:
FIG. 5 is a sectional view taken along line 5—5 in FIG. 4.

In FIGS. 4 and 5 there is shown the voltage threshold material 16 preformed in the shape of a washer so that it may be placed in the assembly as shown in FIGS. 2 and 3. In particular FIG. 3 illustrates the material 16 (as a washer) between an inner electrode 17 and outer metal case 12 of the assembly. The washer is selected such that its outer diameter is larger than the inner diameter of the case 12 and its inner diameter is less than the outer diameter of the electrode 17 in contact therewith, so that it fits tightly (squeezed) to make good electrical and physical contact with the parts with which it is in contact. The electrode 16 is electrically coupled to wire 13 by soldering of conducting adhesive or electrode 17 and wire 13 may be one piece.

In this manner the semiconductor junction is protected against over-voltage since the material 16 is in parallel with the PN junction.

The material 16 will rapidly breakdown in a time believed to be less than junction breakdown time and occurs at a lower voltage than the reverse breakdown voltage of the junction. In the preferred embodiment a potting compound 15, e.g., epoxy or glass is used to effect a hermatic seal. A terminator lug 18 is crimped to make contact with the electrode narrow portion 17-1.

It should be realized that shapes other than a washer may be used for the material 16 depending upon the application and packaging, e.g., rings, grommet. In order to make the material 16 as a washer as shown, preferably a plastic binder, e.g., a rubber, a curing agent, mechanical reinforcement particles, e.g., silica are mixed with silicon carbide particles and Group IV B element—carbide particles. The mixture is then worked on a roll mill to homogeneously mix (uniformly disperse) the silicon carbide and Group IV B element—carbide particles and silica in the rubber and it is then sheeted out. In the invention herein the preferred Group IV B element—carbide particles are Titantium carbide particles and the preferred plastic is silicone gum.

Suitable plastics may include elastomers and non-elastomers depending upon the application. Suitable plastics, (the term as used herein meant to include rubber and other elastomers thermosetting plastics, and thermoplastics) includes e.g., silicone rubber, fluorosilicone rubbers, chloroinated or chlorosulphonated polyethylene, polyethylene, polybutylene, polypropylene, ethycellulose, polyamide, natural rubber, SBR, neoprene, nitrile rubber, butyl rubber, epoxy and polyurethane rubber.

Thereafter the sheet is cured in a press and the washer or other configuration as needed is punched out or die cut therefrom. Obviously the washer or sheet can be molded if desired or the material 16 may be made in situ using a potting composition of the material which cures in place. The parameters of cure can obviously change, however it is preferred that if rubber is selected it have about a 4 to 4.5% shrinkage on cure to increase the volume loading of the particles in the form stable material 16.

In practice it has been found that a suitable formulation for making the low voltage breakdown of threshold material 16 comprises a base (binder) mixture of:
0.24 grams Varox (50%) as curing agent;
0.566 grams plastisizer E 2636—Dow Corning;
2.26 grams silicone fluid 190 200 (low viscosity) Dow Corning;
2.26 grams Cab-O-Sil silica particles for mechanical reinforcement;
24.64 grams silicone gum, Dow Corning, GE, etc. (binder)

The binder mixture is about 60% by volume of the above material 16 with the silicone gum being about 50.74 Vol. percent.

The above ingredients are added together to form a base mixture. To one part by weight of base mixture made from the above ingredients there is added;
(11.88% by Vol.)25 grams Titanium Carbide (−200+325 Mesh screen) (Shield Alloy Corp.)
(28.64% by Vol.)45 grams parts of #240 grit electrical grade Silicon Carbide particles (Carborundum);

Thereafter the combined material is worked on two roll mill for 10 minutes at room temperature and the material is sheeted out to about 64 mils thickness. The material is then cured in a press at 340° F. for 10 minutes at 1000 Psi to produce a sheet of 62 mils thickness. In place of #240 Carborundum Silicon Carbide, sold as "Crystalon B" by NORTON CO., may be used.

The sheet thickness may obviously be varied depending upon requirements, however a thickness of 10 mils to 400 mils may be conveniently made. At this time the sheet is die cut to provide the washer 16. The above provides a material 16 having a bidirectional threshold conduction of less than about 25-50 volts. It should be understood that the invention herein is applicable to at least silicon and germanium semiconductor junction devices.

In this invention it is preferred that the sheet be loaded such that about 20-35 percent by Vol. of silicon carbide is used and 5-20 percent by Vol. of Group IV B element—carbide particles is used e.g., titanium carbide, zirconium carbide, and etc. This provides a preferred volume loading of about 25 to 55% of particles as used herein volume loading is calculated based on the total of plastic binder+SiC particles and Group IV B element—carbide particles. Silicon carbide particles and the Group IV B element—carbide e.g. titanium carbide, zirconium carbide, hafnium carbide particles are preferably selected so that they have an average particle size of between 75 microns to about 3 microns.

In this invention the threshold conduction voltage of the material may be varied depending upon the requirement, however it may be conveniently between about 1000 to 25 volts (+ or −) since this meets the requirements of most high voltage power diodes as well as lower voltage applications.

Figure 6:
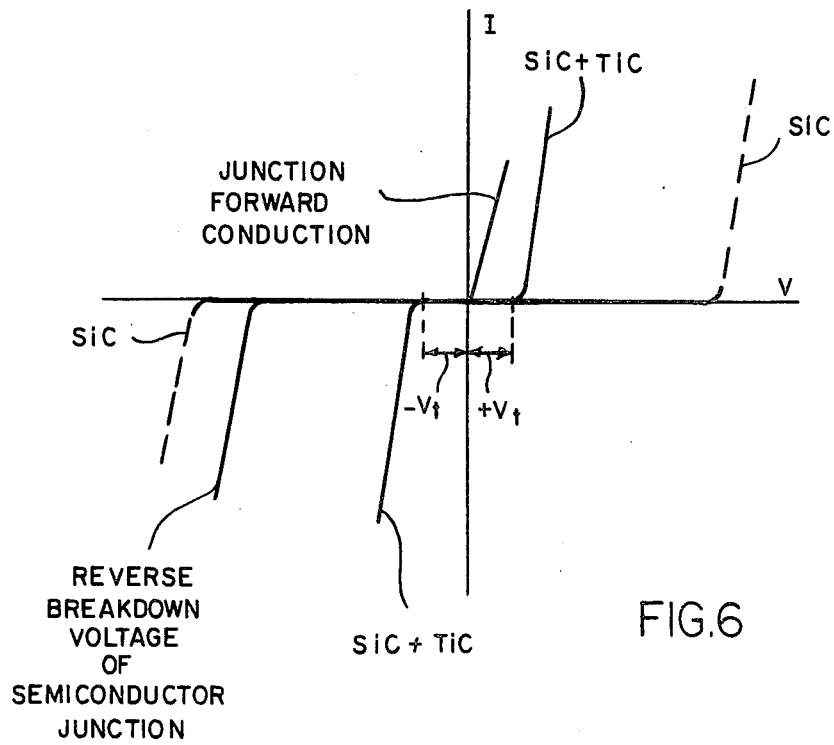
FIG. 6 is a graph illustrating the IV characteristic of the material 16 relative to the semiconductor junction device reverse breakdown voltage.

In FIG. 6 there is shown the typical reverse breakdown voltage curve of a semiconductor junction and the typical threshold conduction voltage for the material 16 if made with SiC+TiC. By proper selection of the material 16, it is possible to prevent the destruction of the junction since the material 16 will conduct to ground an over-voltage before a voltage causing junction breakdown is reached. The threshold conduction voltage of the material 16 will obviously be adjusted by adjusting the particle loading to insure threshold conduction of the material is set high enough so that negative and positive voltages normally encountered will not cause it to conduct significantly. In this figure the dashed curve illustrates the characteristics if made only with equal loading of SiC particles. A comparison between the curves illustrates the significant decrease in threshold conduction with the present invention. In practice, about a 3 to 6 to 1 decrease 300 to 600% from about 150:50 to 25 volts has been achieved with this invention without significantly effecting the desired characteristics of the material for its intended use. It is thus clear that the present material will function in situations in which an SiC material would not be useful.

Figure 7:
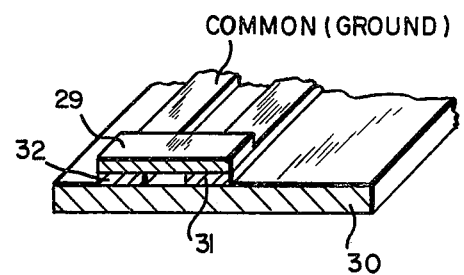
FIG. 7 is a sectional view of conventional circuit board illustrating the use of the material of this invention between two circuit lines thereof.

In FIG. 7, there is shown a piece 29 of threshold conduction sheet material coupled e.g., by electrically conductive adhesive between or across circuit pattern lines 31 and 32 (e.g., copper or electrically conductive ink) on a conventional dielectric e.g., plastic circuit board 30. In this manner if an overvoltage greater than the threshold conduction voltage occurs, piece 29 will rapidly conduct and prevent damage to components coupled between lines 31 and 32. In this figure line 30 is grounded.

We claim:

1. As an article of manufacture, a threshold voltage conduction material comprising a dielectric plastic binder having dispersed therein particulate silicon carbide and a lesser amount by volume of particulate Group IV B element—carbide.

2. As an article of manufacture, a threshold voltage conduction material comprising a dielectric plastic binder having dispersed therein particulate silicon carbide and a lesser amount by volume of particulate titanium carbide.

3. The material of claim 1 in which the element—carbide is particulate zirconium carbide.

4. The material of claim 1, 2 or 3 in which the binder is an elastomer.

5. The material of claim 1, 2 or 3 in which the silicon carbide is about 20 to 35 volume percent of the total volume of binder and particulate and the Group IV B element—carbide is about 5 to 20 volume percent of the total volume of binder and particulate.

6. The material of claim 2 in which the silicon carbide is about 20 to 35 volume percent of the total volume of binder and particulate and the titanium carbide is about 5 to 20 volume percent of the total volume of binder and particulate in which the binder is an elastomer.

7. The material of claim 6 in which the binder is silicone plastic.

8. The material of claim 1,2,3,6 or 7 in which the threshold conduction is between about 1000 to 25 volts.

9. An assembly containing a semiconductor junction and a threshold conducting material coupled in parallel with said junction, said material being form stable and having dispersed therein particulate silicon carbide and a lesser amount by volume of particulate Group IV B element—carbide.

10. The assembly of claim 9 in which the volume percent of silicon carbide is about 20 to 35 volume percent of the total volume of binder and particulate and the volume percent of the Group IV B element—carbine is about 5 to 20 volume percent of the total volume of binder and particulate.

11. The assembly of claim 9 or 10 in which the binder is an elastomer.

12. The assembly according to claim, 10 in which the assembly comprises an outer metal casing in which the junction is positioned, an electrode coupled to one side of the junction and the casing coupled to the other side of the junction, the material positioned in electrical contact with said casing and said electrode.

13. The assembly of claim 12 in which said material is in the form of a washer the portion thereof defining the outsize diameter of the washer in contact with the casing and the portion thereof defining the inner diameter in contact with the electrode.

14. An assembly comprising at least two electrodes or circuit lines having electrically coupled between them a threshold voltage conduction material comprising a dielectric plastic binder having dispersed therein particulate silicon carbide and a lesser amount by volume of particulate Group IV B element—carbide.

15. The assembly of claim 14 in which the circuit lines are on a dielectric circuit board.

16. The assembly of claim 14 in which the element—carbide is titanium carbide.

17. The assembly of claim 14, 15 or 16 in which the volume percent of the silicon carbide is about 20 to 35 volume percent of the total volume percent of binder and particulate and the volume percent of the Group IV B element—carbide is about 5 to 20 volume percent of the total volume of binder and particulate.

* * * * *

UNITED STATES PATENT AND TRADEMARK OFFICE
CERTIFICATE OF CORRECTION

PATENT NO. : 4,331,948
DATED : May 25, 1982
INVENTOR(S) : Paul J. Malinaric and Vincent Squitieri It is certified that error appears in the above-identified patent and that said Letters Patent is hereby corrected as shown below:

Col. 1, line 51, change "Titantium" to ---Titanium---;
Col. 2, line 49, change "hermatic" to ---hermetic---;
Col. 2, line 63, change "Titatium" to ---Titanium---;
Col. 3, line 3, change "chloroinated" to ---chlorinated---;
Col. 3, line 22, change "plastisizer" to ---plasticizer---;
Col. 3, line 23, delete "190";
Col. 3, line 40, change ";" to ---.---;
Col. 3, line 63, insert a period after "particles" and capitalize "as";
Col. 4, line 28, change "effecting" to ---affecting---.

Signed and Sealed this

Third Day of January 1984

[SEAL]

Attest:

GERALD J. MOSSINGHOFF

Attesting Officer    Commissioner of Patents and Trademarks